United States Patent
Liu et al.

(10) Patent No.: US 8,629,531 B2
(45) Date of Patent: Jan. 14, 2014

(54) STRUCTURE AND METHOD TO REDUCE WAFER WARP FOR GALLIUM NITRIDE ON SILICON WAFER

(75) Inventors: Ming Chyi Liu, Hsinchu (TW); Hsieh Ching Pei, Kaohsiung (TW); Jiun-Lei Yu, Zhudong Township, Hsinchu County (TW); Chi-Ming Chen, Zhubei (TW); Shih-Chang Liu, Alian Township, Kaohsiung County (TW); Chung-Yi Yu, Hsin-Chu (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 245 days.

(21) Appl. No.: 13/030,645

(22) Filed: Feb. 18, 2011

(65) Prior Publication Data

US 2012/0211759 A1 Aug. 23, 2012

(51) Int. Cl.
*H01L 21/20* (2006.01)
*H01L 21/18* (2006.01)

(52) U.S. Cl.
USPC ............... 257/615; 257/190; 257/E21.127; 438/483; 438/478; 438/46; 438/47

(58) Field of Classification Search
USPC ............ 257/190, E21.127, 620, 615; 438/46, 438/47, 478, 483, 462
See application file for complete search history.

(56) References Cited

U.S. PATENT DOCUMENTS

| | | | | |
|---|---|---|---|---|
| 8,168,000 B2 * | 5/2012 | Briere et al. | ..................... | 117/95 |
| 8,263,425 B2 * | 9/2012 | Chang et al. | ..................... | 438/47 |
| 2005/0054180 A1 | 3/2005 | Han et al. | | |

\* cited by examiner

*Primary Examiner* — Calvin Lee
*Assistant Examiner* — Scott Stowe
(74) *Attorney, Agent, or Firm* — Haynes and Boone, LLP (57) ABSTRACT

The present disclosure provides a semiconductor structure. The semiconductor structure includes a dielectric material layer on a silicon substrate, the dielectric material layer being patterned to define a plurality of regions separated by the dielectric material layer; a first buffer layer disposed on the silicon substrate; a heterogeneous buffer layer disposed on the first buffer layer; and a gallium nitride layer grown on the heterogeneous buffer layer only within the plurality of regions.

25 Claims, 8 Drawing Sheets

STRUCTURE AND METHOD TO REDUCE WAFER WARP FOR GALLIUM NITRIDE ON SILICON WAFER

BACKGROUND

In semiconductor technology, due to its characteristics, gallium nitride (GaN) is used to form various integrated circuits, such as high power field-effect transistors, high frequency transistors, or light-emitting diodes (LEDs). Usually, GaN is formed on a substrate, such as a sapphire or silicon carbide substrate, with a certain crystalline lattice mismatch. Such substrates are expensive in terms of material and/or fabrication. Because GaN on silicon is an ideal structure for high power devices or LEDs, with reduced costs, it is desired to grow GaN on a silicon substrates. However, the lattice mismatch and thermal expansion difference between GaN and Si is a big issue that can cause undesirable warpage and relaxation. Therefore, a semiconductor structure having GaN on a silicon substrate designed to address the above issues and a method of making the same are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIGS. 1 through 4 are sectional views of one embodiment of a semiconductor structure 100 having gallium nitride on a silicon substrate at various fabrication stages. FIGS. 5 through 8 are top views of a dielectric pattern in the semiconductor structure 100 constructed according to various embodiments of the present disclosure. With reference to FIGS. 1 through 8, the semiconductor structure 100 and a method of making the same are collectively described.

Figure 1:
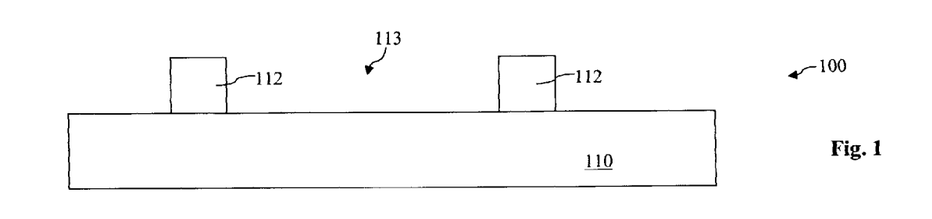
FIGS. 1 through 4 are sectional views of one embodiment of a semiconductor structure having gallium nitride on a silicon substrate at various fabrication stages.

Referring to FIG. 1, the semiconductor structure 100 includes a silicon substrate 110. The silicon substrate 110 is a (111) silicon wafer. Specifically, the silicon substrate 110 has a top surface in a (111) plane, where the (111) is a crystalline plane represented by Miller indexes as know in the art. The (111) silicon substrate is chosen for a proper lattice mismatch.

A blocking layer (mask or hard mask) 112 is formed on the silicon substrate 110. The blocking layer 112 includes a material to block gallium nitride from growing thereon. In one embodiment, the blocking layer 112 includes a dielectric material, such as silicon oxide, silicon nitride, or silicon oxynitride. The blocking layer 112 can be formed by chemical vapor deposition (CVD), thermal oxidation/nitridation, or other suitable deposition process. In one embodiment, the blocking layer 112 may have a thickness ranging between about 10 angstroms and about 20 microns. In another embodiment, the blocking layer 112 has a thickness ranging between about 1 angstrom and about 20 microns.

The blocking layer 112 is patterned by a procedure including a lithography process and an etch process as known in the art. The blocking layer 112 is patterned to surround and define a plurality of regions 113 of the silicon substrate 110 that are uncovered by the blocking layer 112. The plurality of regions are designed for selective epitaxy growth (or selective growth) of gallium nitride. Particularly, the blocking layer 112 includes a plurality of features extended and intersected to define the plurality of regions 113. In one embodiment, the plurality of regions 113 are shaped in a square, a rectangle, or a triangle. In another embodiment, the blocking layer 112 includes a plurality of solid lines or dashed lines. In one example, those lines of the blocking layer have a width ranging from about 0.1 micron and about 5 mm.

Various embodiments of the patterns of the blocking layer 112 are illustrated in FIGS. 5-8 in top views. Even though various embodiments of the blocking layer 112 are presented, it is not intended to be limiting. Other patterns may be present without departure of the present disclosure. The purpose is to divide the silicon substrate 110 into multiple small pieces for reducing warpage.

Figure 5:
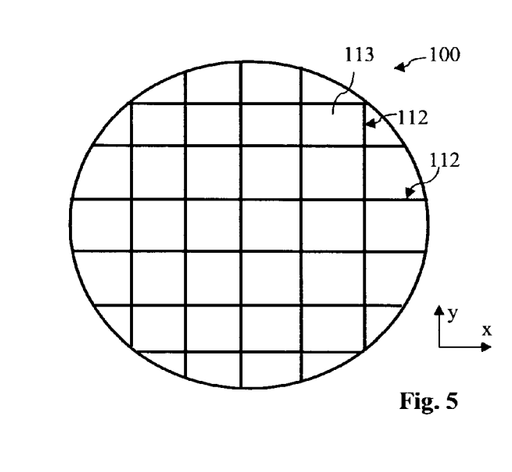
FIGS. 5 through 8 are top views of a dielectric pattern in the semiconductor structure of FIG. 1 constructed according to various embodiments of the present disclosure.

In FIG. 5, the semiconductor structure 100 includes a silicon wafer oriented in the (111) plane. The blocking layer 112 includes a first set of features extended in a first direction (x direction) and a second set of features extended in a second direction (y direction) different from the first direction. In the present embodiment, the first and second directions are perpendicular to each other. In one example, the first set of features are spaced from each other with a spacing ranging between about 100 microns and about 100 mm. In a similar example, the second set of features are spaced from each other with a spacing ranging between about 100 microns and about 100 mm. In one embodiment, the first and second sets of features are straight lines extending over the silicon wafer. The first set of features and the second set of features intersect, defining the plurality of regions 113 in a square or rectangle geometry. Thus, the silicon wafer is divided into the plurality of regions 113.

Figure 6:
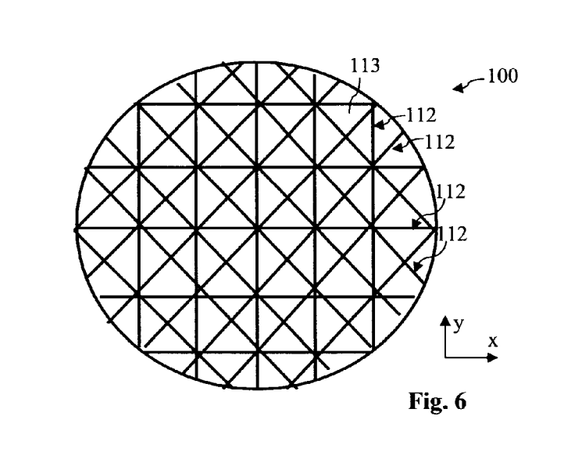

As another embodiment in FIG. 6, the semiconductor structure 100 includes a silicon wafer oriented in (111) plane. Similar to FIG. 5, the blocking layer 112 includes a first set of features extended in a first direction (x direction) and a second set of features extended in a second direction (y direction) different from the first direction. In the present embodiment, the first and second directions are perpendicular to each other. The first and second sets of features are straight lines extending over the silicon wafer. Additionally, the blocking layer 112 includes a third set of features extended in a third direction (e.g., a direction that equally splits the angle between the x and y directions) and a fourth set of features extended in a fourth direction (e.g., a direction that equally splits the angle between the x and y directions) different from the third direction. In the present embodiment, the third and fourth directions are perpendicular to each other. The third and fourth sets of features are straight lines extended over the silicon wafer. In one example, the first set of features are spaced from each other with a spacing ranging between about 100 microns and about 100 mm. In a similar example, the second, third, or fourth sets of features are spaced from each other with a spacing ranging between about 100 microns and about 100 mm. The first, second, third, and fourth sets of features are intersected, defining the plurality of regions 113 in a triangle geometry. Accordingly, the silicon wafer is divided into the plurality of regions 113.

Figure 7:
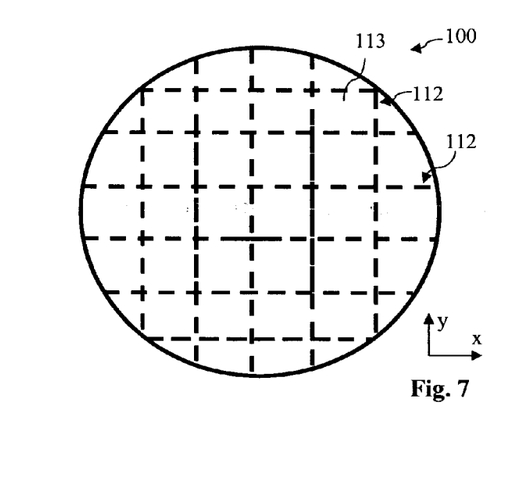

In FIG. 7, the semiconductor structure 100 includes a silicon wafer oriented in the (111) plane. The blocking layer 112 includes a first set of features extended in a first direction (x direction) and a second set of features extended in a second direction (y direction) different from the first direction. In the present embodiment, the first and second sets of features are dashed lines (not continuously) extended over the silicon wafer. The first and second directions are perpendicular to each other. In one example, the first set of features are spaced from each other with a spacing ranging between about 100 microns and about 100 mm. In a similar example, the second set of features are spaced from each other with a spacing ranging between about 100 microns and about 100 mm. The first set of features and the second set of features intersect, defining the plurality of regions 113 in a square or rectangle geometry. Thus, the silicon wafer is divided into the plurality of regions 113.

Figure 8:
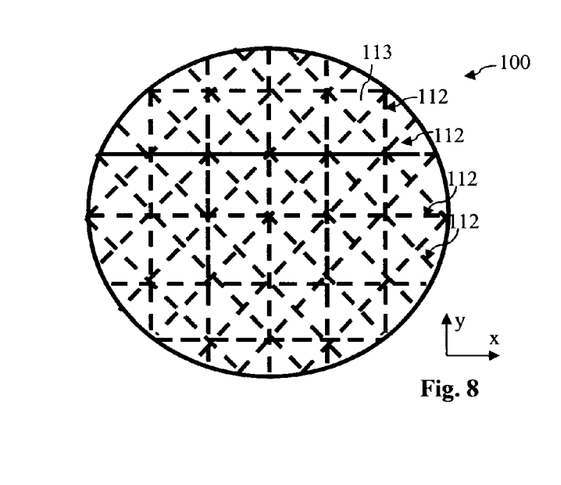

In FIG. 8, the semiconductor structure 100 includes a silicon wafer oriented in the (111) plane. In the present embodiment, the plurality of features in the blocking layer 112 are dashed lines. Similar to FIG. 6, the blocking layer 112 includes a first set of features extended in a first direction (x direction) and a second set of features extended in a second direction (y direction) different from the first direction. In the present embodiment, the first and second directions are perpendicular to each other. The first and second sets of features are straight lines extended over the silicon wafer. Additionally, the blocking layer 112 includes a third set of features extended in a third direction (e.g., a direction that equally splits the angle between the x and y directions) and a fourth set of features extended in a fourth direction (e.g., a direction that equally splits the angle between the x and y directions) different from the third direction. In the present embodiment, the third and fourth directions are perpendicular to each other. The third and fourth sets of features are straight lines extended over the silicon wafer. In one example, the first set of features are spaced from each other with a spacing ranging between about 100 microns and about 100 mm. In a similar example, the second, third, or fourth sets of features are spaced from each other with a spacing ranging between about 100 microns and about 100 mm. The first, second, third, and fourth sets of features intersect and define the plurality of regions 113 in a triangle geometry. Accordingly, the silicon wafer is divided into the plurality of regions 113.

Other geometries may present in the plurality of regions 113 defined in the blocking layer 112. In one embodiment, the plurality of regions 113 are defined with circular shape. In another embodiment, the plurality of regions 113 are defined to have rounding corners. For example, each of the plurality of regions 113 in square shape has four corners patterned as rounding corners.

Figure 2:
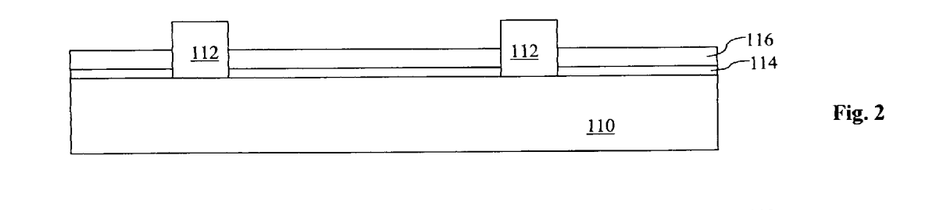

Referring to FIG. 2, a first buffer layer 114 is formed on the silicon substrate 110. In one embodiment, the first buffer layer includes aluminum nitride (AlN) selectively epitaxy grown on the silicon substrate 110. The first buffer layer 114 can be epitaxy grown by metal organic vapor phase epitaxy (MOVPE) using aluminum-containing precursor and nitrogen-containing precursor. The aluminum-containing precursor includes trimethylaluminum (TMA), triethylaluminum (TEA), or other suitable chemical. The nitrogen-containing precursor includes ammonia ($NH_3$), tertiarybutylamine (TBAm), phenyl hydrazine, or other suitable chemical. In one example, the first buffer layer 114 has a thickness ranging between about 20 angstroms and about 100 angstroms.

Still referring to FIG. 2, a second buffer layer 116 is selectively epitaxy grown on the first buffer layer 114. The second buffer layer 116 is heterogeneous. Particularly, the second buffer layer 116 is not uniform in composition in the vertical direction perpendicular to the silicon substrate 110. In one embodiment, the second buffer layer 116 includes a graded aluminum gallium (AlGaN). In furtherance of the present embodiment, the graded AlGaN in the second buffer layer 116 has an aluminum concentration that decreases from the bottom surface to the top surface of the second buffer layer 116 and a gallium concentration that increases from the bottom surface to the top surface of the second buffer layer 116. Thus, the graded AlGaN layer is more similar to the AlN of the first buffer layer 114 at the bottom surface and is more similar to GaN at the top surface for acceptable lattice mismatch. The AlGaN layer is selectively epitaxy grown on the AlN of the first buffer layer 114. The second buffer layer 116 can be epitaxy grown by MOVPE using aluminum-containing precursor, gallium-containing precursor, and nitrogen-containing precursor. The aluminum-containing precursor includes TMA, TEA, or other suitable chemical. The gallium-containing precursor includes trimethylgallium (TMG), triethylgallium (TEG), or other suitable chemical. The nitrogen-containing precursor includes ammonia, TBAm, phenyl hydrazine, or other suitable chemical. During the epitaxy growth of the graded AlGaN layer, the supplies of precursors are dynamically tuned according to the expected concentrations of aluminum and gallium to form the expected graded structure. In one example, the second buffer layer 116 has a thickness ranging between about 30 angstroms and about 500 angstroms.

Alternatively, the second buffer layer 116 includes a super lattice structure. The super lattice structure has a periodic structure of two or more materials. In one example, the thickness of each layer ranges between about 1 nanometer to about 10 nanometers. The super lattice structure can also be epitaxy grown by MOVPE with alternative precursors. In one example, the second buffer layer 116 includes a super lattice structure of GaN and AlN (GaN/AlN). The GaN layers are epitaxy grown by MOVPE using gallium-containing precursor and nitrogen-containing precursor. The gallium-containing precursor includes TMG, TEG, or other suitable chemical. The nitrogen-containing precursor includes ammonia, TBAm, phenyl hydrazine, or other suitable chemical. In another example, the second buffer layer 116 includes a super lattice structure of GaN and AlGaN (GaN/AlGaN). The GaN/AlGaN super lattice structure can also be epitaxy grown by MOVPE with alternative precursors intended for GaN and AlGaN, respectively. The GaN and AlGaN precursors are similar to those corresponding precursors introduced previously. In yet another example, the second buffer layer 116 includes a super lattice structure of two different AlGaN layers. The first AlGaN layer(s) has a higher aluminum concentration and a lower gallium concentration. The second AlGaN layer(s) has a lower aluminum concentration and a higher gallium concentration. The AlGaN super lattice structure can also be epitaxy grown by MOVPE with alternative concentrations of the corresponding precursors intended for the first and second AlGaN layers, respectively. The AlGaN precursors are similar to those corresponding precursors introduced previously.

Figure 3:
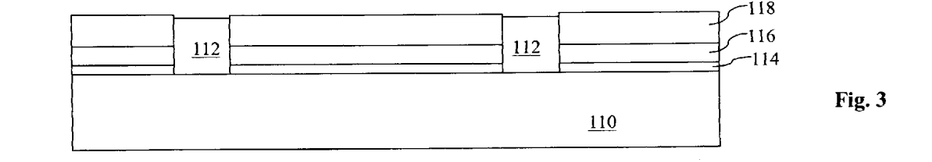

Referring to FIG. 3, a gallium nitride (GaN) layer 118 is selectively epitaxy grown on the second buffer layer 116 within the plurality of regions 113. The GaN layer 118 is epitaxy grown by MOVPE using gallium-containing precursor and nitrogen-containing precursor. In one example, the gallium-containing precursor includes TMG, TEG, or other suitable chemical. In another example, the nitrogen-containing precursor includes ammonia, TBAm, phenyl hydrazine, or other suitable chemical. In another example, the GaN layer 118 fills in the regions 113 surrounded by the blocking layer 112 and substantially coplanar with the blocking layer 112 at the top surfaces. In another example, the thickness of the GaN layer 118 ranges between about 1 micron and about 20 microns.

By implementing the semiconductor structure 100 of the present disclosure, the GaN layer 118 on the silicon substrate 110 is not continuous but divided into the plurality of regions 113 separated by the blocking layer 112. The stress built in the GaN layer 118 due to the lattice mismatch is localized to the regions 113 and is decoupled from region to region by the discontinuous gaps in the plurality of features of the blocking layer 112. Warpage of the silicon substrate 110 is thus effectively eliminated or reduced. The geometry of the regions 113 can be designed to effectively reduce the warpage of the silicon substrate 110. Further, the size of the regions 113 can be tuned to effectively reduce the warpage. Since the warpage is substantially small when the wafer is 4 inches in diameter, the lineal size of the regions 113 (or the spacing of the lines of the blocking layer 112) may be up to about 100 mm.

Figure 4:
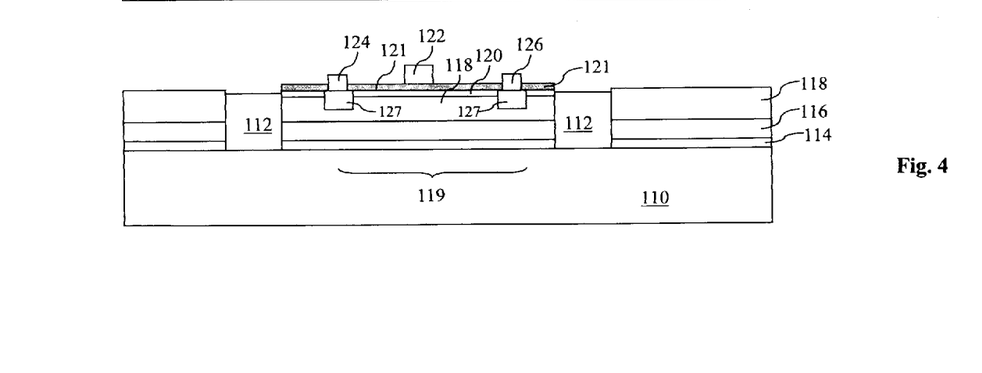

Referring to FIG. 4, various integrated circuit (IC) devices can be formed on the gallium nitride layer 118. In various embodiments, the IC device includes a high power device, a field-effect transistor (FET), a light-emitting diode (LED), a high-frequency device, a high electron mobility transistor (HEMT), or other suitable IC device. In one embodiment, an exemplary high electron mobility transistor 119 is formed on the gallium nitride layer 118 within one of the regions 113.

In the present embodiment, the GaN layer 118 is non-doped or at least a top portion of the GaN layer 118 is non-doped. A thin n-type doped AlGaN layer 120 is formed on the GaN layer 118. In one example, the AlGaN layer 120 is doped by silicon. With such configuration, a two-dimensional electron gas (2DEG) is formed on the surface of the GaN layer 118. The 2DEG has high electron mobility since the electrons generated in the thin AlGaN layer 120 drop in the undoped GaN layer 118, reducing the resistivity related to the impurities.

A thin dielectric material layer 121 is formed on the AlGaN layer 120. The dielectric material layer 121 includes silicon nitride (SiN). In one example, the SiN layer 121 may be formed by atomic layer deposition (ALD) or other suitable technique. The dielectric material layer 121 may alternatively or additionally include other dielectric material, such as silicon oxynitride, silicon oxide, or high dielectric constant (high-k) material (e.g., hafnium oxide)).

The transistor 119 includes a gate electrode (or gate) 122 disposed on the dielectric material layer 121 and separated from the AlGaN layer 120 by the dielectric material layer 121. The gate electrode 122 includes a conductive material such as a metal. Other contacts such as source contact 124 and drain contact 126 are configured on both sides of the gate 122 and may include similar conductive material. Further, Ohm contacts 127 are formed by doping the GaN layer 118 with aluminum or titanium (Al/Ti) underlying the source/drain contacts 124 and 126.

Figure 9:
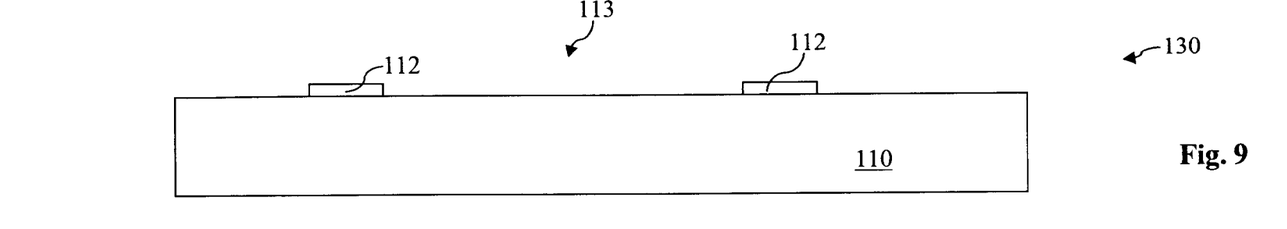
FIGS. 9 through 11 are sectional views of another embodiment of a semiconductor structure having gallium nitride on a silicon substrate at various fabrication stages.
Figure 10:
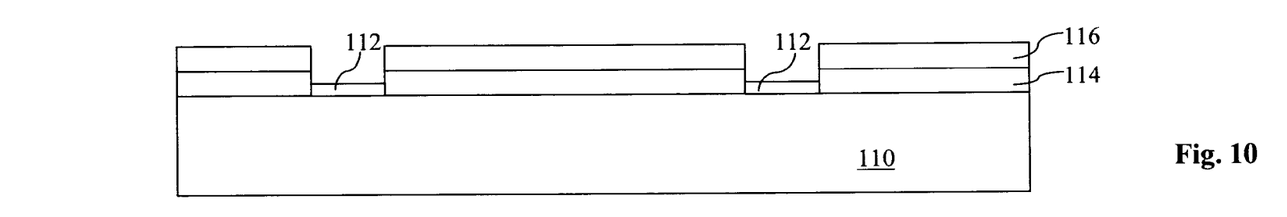
Figure 11:
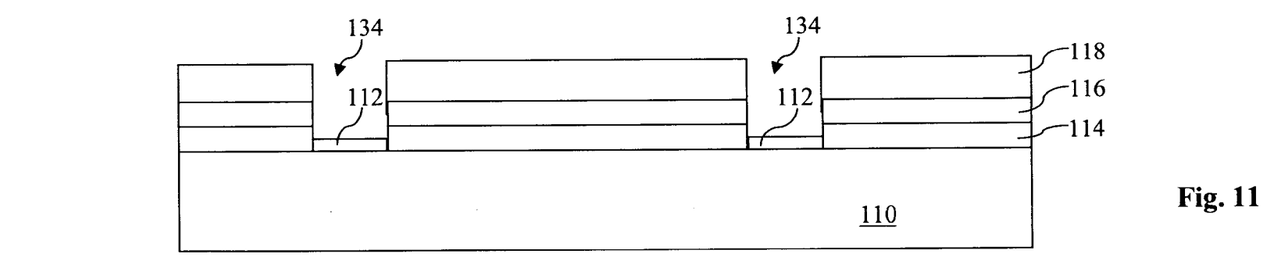

FIGS. 9 through 11 are sectional views of a semiconductor structure 130 having gallium nitride on a silicon substrate at various fabrication stages, constructed according to various aspects of another embodiment. With reference to FIGS. 9 through 12, the semiconductor structure 130 and a method of making the same are collectively described.

Referring to FIG. 9, the semiconductor structure 130 includes a silicon substrate 110. The silicon substrate 110 is a (111) silicon wafer. Specifically, the silicon substrate 110 has a top surface in a (111) plane for proper lattice mismatch.

A blocking layer 112 is formed on the silicon substrate 110. The blocking layer 112 is similar to the blocking layer 112 of FIG. 1. For example, the blocking layer 112 includes a material to block gallium nitride from growing thereon. In one embodiment, the blocking layer 112 includes a dielectric material, such as silicon oxide, silicon nitride, or silicon oxynitride. The blocking layer 112 can be formed by chemical vapor deposition (CVD), thermal oxidation/nitridation, or other suitable deposition process. However, the blocking layer 112 is substantially thinner than the blocking layer 112 of FIG. 1. In one example, the blocking layer 112 has a thickness ranging between about 10 angstroms and about 100 nanometers.

The blocking layer 112 is patterned to divide the silicon substrate 110 into a plurality of regions 113 in a similar way as the blocking layer 112 of FIG. 1. For example, the plurality of regions 113 of the silicon substrate 110 are uncovered by the blocking layer 112 and are designed for selective epitaxy growth of gallium nitride. Particularly, the blocking layer 112 includes a plurality of features extending over the substrate 110 and intersecting to define the plurality of regions 113. In one embodiment, the plurality of regions 113 are shaped in a square, rectangle, or triangle. In another embodiment, the blocking layer 112 includes a plurality of solid lines or dashed lines. In one example, the lines of the blocking layer have a width ranging from about 0.1 micron and about 5 mm. Various patterns of the blocking layer 112 are similar to the corresponding one of the semiconductor structure 100, such as those illustrated in FIGS. 5 through 8 as a few examples. The size of the regions 113 can be tuned to effectively reduce warpage.

A first buffer layer 114 is selectively epitaxy grown on the silicon substrate 110 within the regions 113, and a second buffer layer 116 is selectively epitaxy grown on the first buffer layer 114 within the regions 113 as illustrated in FIG. 10. The first and second buffer layers (114 and 116) are substantially similar to the corresponding layers of FIG. 2 in terms of composition and formation.

A gallium nitride layer 118 is selectively epitaxy grown on the second buffer layer 116 within the plurality of regions 113 as illustrated in FIG. 11. The gallium nitride layer 118 is substantially similar to the corresponding layer of FIG. 3 in terms of composition and formation. Various trenches 134 are formed on the blocking layer 112 after the formation of the first and second buffer layers (114 and 116) and the gallium nitride layer 118. Thus, the GaN layer 118 on the silicon substrate 110 is not continuous but is divided into the plurality of regions 113 separated by the blocking layer 112. The stress built in the GaN layer 118 due to the lattice mismatch is localized to each of the regions 113 and is decoupled from region to region. Warpage of the silicon substrate 110 is thus effectively eliminated or reduced. Various IC devices can be formed on the gallium nitride layer 118 afterward.

FIGS. 12 through 15 are sectional views of a semiconductor structure 140 having gallium nitride on a silicon substrate at various fabrication stages, constructed according to various aspects of another embodiment. With reference to FIGS. 12 through 15, the semiconductor structure 140 and a method of making the same are collectively described.

Figure 12:
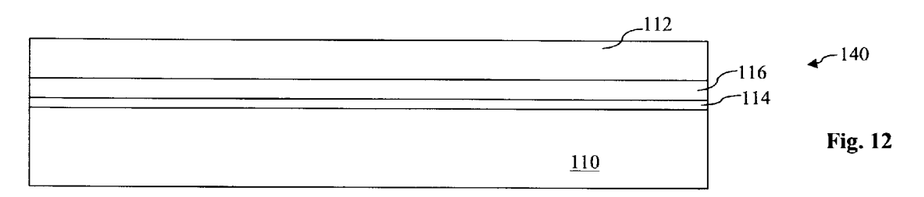
FIGS. 12 through 15 are sectional views of another embodiment of a semiconductor structure having gallium nitride on a silicon substrate at various fabrication stages.

Referring to FIG. 12, the semiconductor structure 140 includes a silicon substrate 110. The silicon substrate 110 is a (111) silicon wafer. Specifically, the silicon substrate 110 has a top surface in a (111) plane for proper lattice mismatch.

In contrast to the semiconductor structure 100 in FIG. 1, various buffer layers are epitaxy grown on the silicon substrate 110 before the formation of the blocking layer 112. A first buffer layer 114 is epitaxy grown on the silicon substrate 110, and a second buffer layer 116 is epitaxy grown on the first buffer layer 114 as illustrated in FIG. 12. The first and second buffer layers (114 and 116) are substantially similar to the corresponding layers of FIG. 2 in terms of composition and formation.

A blocking layer 112 is formed on the second buffer layer 116. The blocking layer 112 is similar to the blocking layer 112 of FIG. 1 in terms of composition. For example, the blocking layer 112 includes a dielectric material, such as silicon oxide, silicon nitride, or silicon oxynitride. The blocking layer 112 can be formed by CVD or other suitable deposition process. In one example, the blocking layer 112 has a thickness ranging between about 1 micron and about 20 microns.

Figure 13:
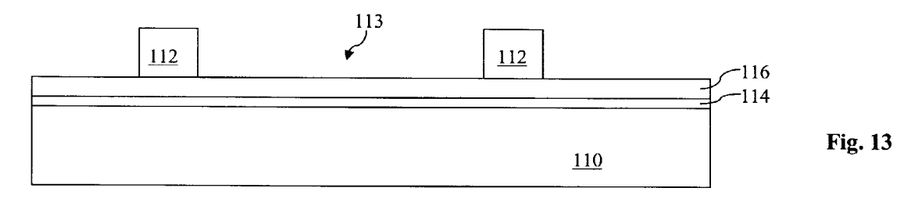

Referring to FIG. 13, the blocking layer 112 is patterned to divide the silicon substrate 110 into a plurality of regions 113 in a similar way as the blocking layer 112 of FIG. 1. For example, the second buffer layer 116 within the plurality of regions 113 are uncovered by the blocking layer 112 and are designed for selective epitaxy growth of gallium nitride. Particularly, the blocking layer 112 includes a plurality of features extending over the second buffer layer 116 and intersecting to define the plurality of regions 113. In one embodiment, the plurality of regions 113 are shaped in a square, a rectangle, or a triangle. In another embodiment, the blocking layer 112 includes a plurality of solid lines or dashed lines. In one example, those lines of the blocking layer have a width ranging from about 0.1 micron and about 5 mm. The pattern of the blocking layer 112 is similar to the corresponding ones of the semiconductor structure 100, such as those illustrated in FIGS. 5 through 8 as a few examples.

Figure 14:
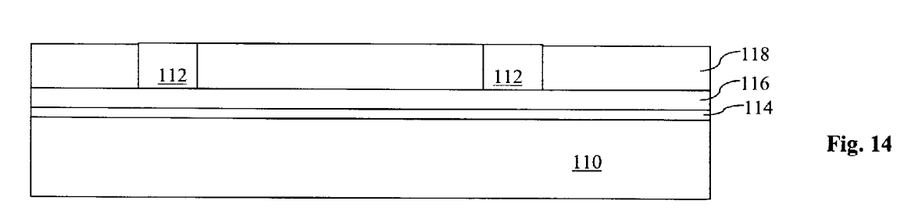
Figure 15:
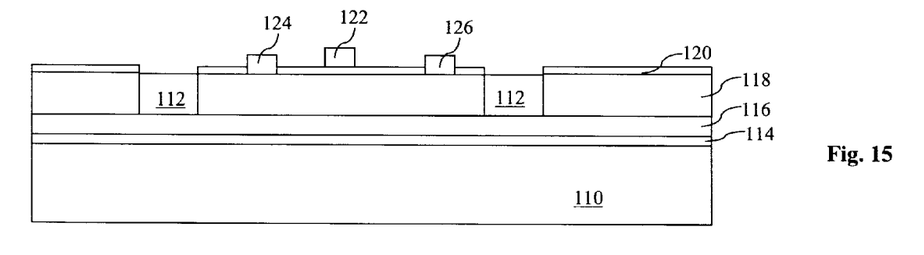

Referring to FIG. 14, a gallium nitride layer 118 is selectively epitaxy grown on the second buffer layer 116 within the plurality of regions 113. The gallium nitride layer 118 is substantially similar to the corresponding layer of FIG. 3 in terms of composition and formation. The gallium nitride layer 118 in the plurality regions 113 is separated by the blocking layer 112, resulting in eliminated or reduced warpage of the silicon substrate 110. Afterward, one or more IC devices can be formed on the GaN layer 118 as illustrated in FIG. 15.

Figure 16:
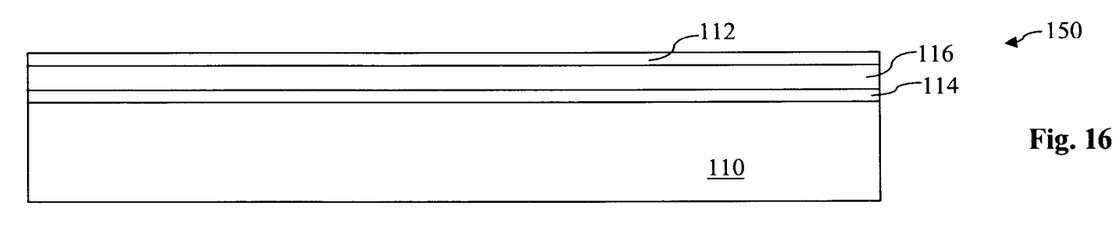
FIGS. 16 through 18 are sectional views of another embodiment of a semiconductor structure having gallium nitride on a silicon substrate at various fabrication stages.
Figure 17:
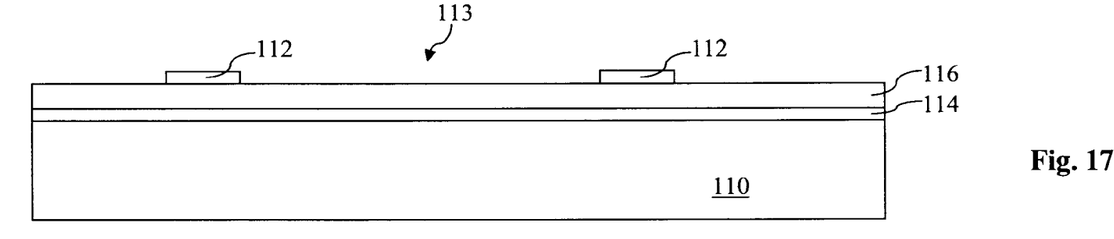
Figure 18:
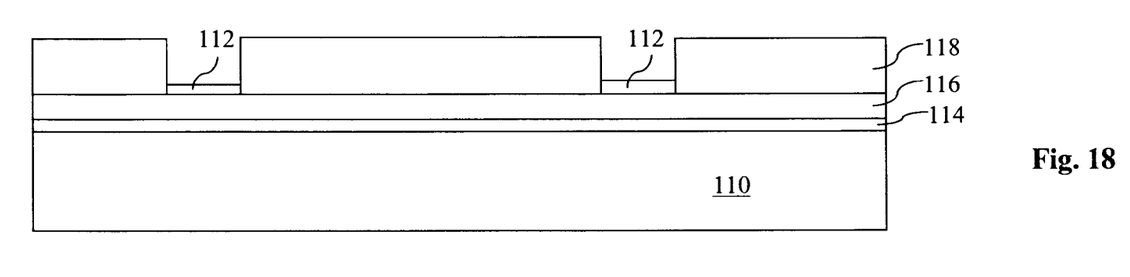

FIGS. 16 through 18 are sectional views of a semiconductor structure 150 having gallium nitride on a silicon substrate at various fabrication stages, constructed according to various aspects of another embodiment. With reference to FIGS. 16 through 18, the semiconductor structure 150 and a method of making the same are collectively described.

Referring to FIG. 16, the semiconductor structure 140 includes a silicon substrate 110. The silicon substrate 110 is a (111) silicon wafer. Specifically, the silicon substrate 110 has a top surface in a (111) plane for proper lattice mismatch.

Various buffer layers are epitaxy grown on the silicon substrate 110 before the formation of the blocking layer 112. A first buffer layer 114 is epitaxy grown on the silicon substrate 110, and a second buffer layer 116 is epitaxy grown on the first buffer layer 114 as illustrated in FIG. 12. The first and second buffer layers (114 and 116) are substantially similar to the corresponding layers of FIG. 12 in terms of composition and formation.

A blocking layer 112 is formed on the second buffer layer 116. The blocking layer 112 is similar to the blocking layer 112 of FIG. 1 in terms of composition. For example, the blocking layer 112 includes a dielectric material, such as silicon oxide, silicon nitride, or silicon oxynitride. The blocking layer 112 can be formed by CVD or other suitable deposition process. In one example, the blocking layer 112 has a thickness ranging between about 10 angstroms and about 100 nanometers.

Referring to FIG. 17, the blocking layer 112 is patterned to divide the silicon substrate 110 into a plurality of regions 113 in a similar way as the blocking layer 112 of FIG. 13. For example, the second buffer layer 116 within the plurality of regions 113 are uncovered by the blocking layer 112 and are designed for selective epitaxy growth of gallium nitride. Particularly, the blocking layer 112 includes a plurality of features extending over the second buffer layer 116 and intersecting to define the plurality of regions 113. In one embodiment, the plurality of regions 113 are shaped in a square, a rectangle, or a triangle. In another embodiment, the blocking layer 112 includes a plurality of solid lines or dashed lines. In one example, the lines of the blocking layer have a width ranging from about 0.1 micron and about 5 mm. In various embodiments, the pattern of the blocking layer 118 is similar to the corresponding ones of the semiconductor structure 100, such as those illustrated in FIGS. 5 through 8 as a few examples.

Referring to FIG. 18, a gallium nitride layer 118 is selectively epitaxy grown on the second buffer layer 116 within the plurality of regions 113. The gallium nitride layer 118 is substantially similar to the corresponding layer of FIG. 3 in terms of composition and formation. Various trenches 134 are formed on the blocking layer 112 after the formation of the first and second buffer layers (114 and 116) and the gallium nitride 118. The GaN layer 118 on the silicon substrate 110 is not continuous but is divided into the plurality of regions 113 separated by the blocking layer 112. The stress built in the GaN layer 118 due to the lattice mismatch is localized to each of the regions 113 and is decoupled from region to region. Warpage of the silicon substrate 110 is thus effectively eliminated or reduced. Various IC devices can be formed on the gallium nitride layer 118 thereafter.

Figure 19:
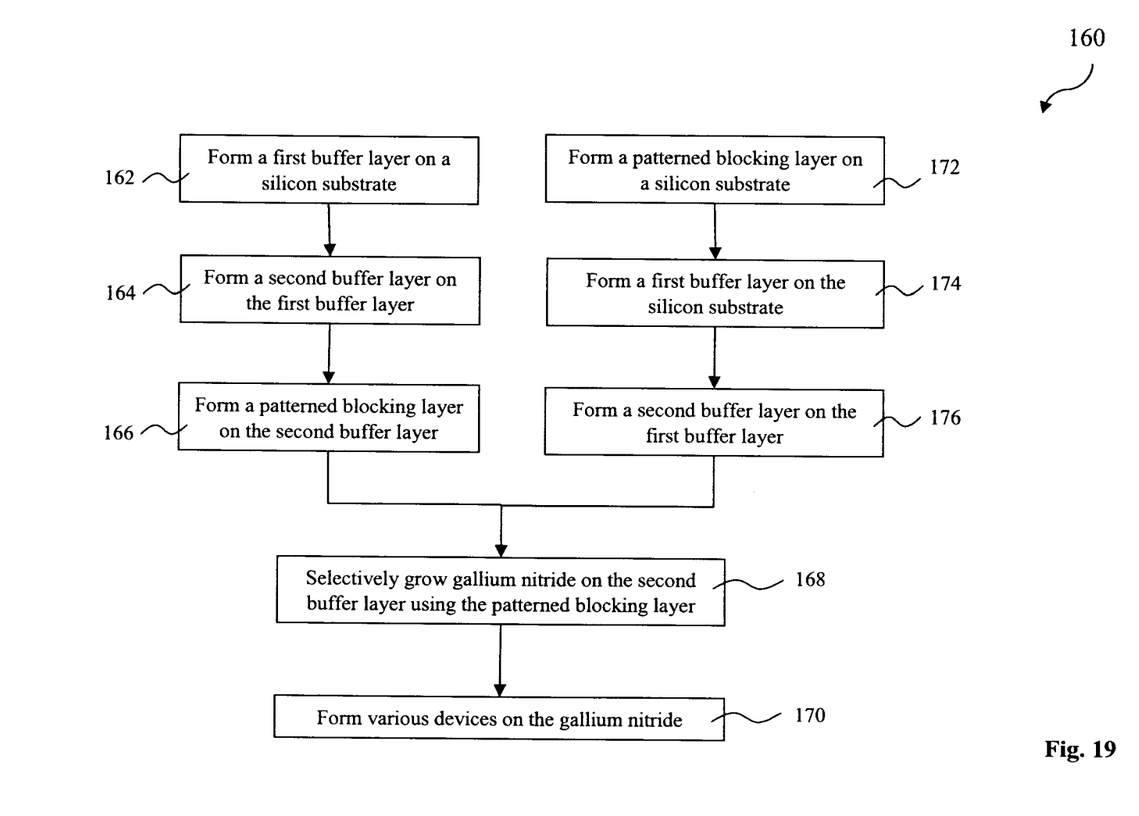
FIG. 19 is a flowchart of a method for making a semiconductor structure having a gallium nitride layer on a silicon substrate according to various embodiments.

FIG. 19 is a flowchart of a method 160 for making a semiconductor structure having a discontinuous gallium nitride layer on a silicon substrate with eliminated or reduced warpage of the silicon substrate according to various embodiments. With further reference to FIGS. 1 through 20, the method 160 is described below.

The method 160 begins at step 162 by forming the first buffer layer 114 on the silicon substrate 110 having a top surface oriented at a (111) plane. The first buffer layer 114 includes aluminum nitride epitaxy grown on the silicon substrate 110 using MOVPE. In one embodiment, the MOVPE uses aluminum-containing precursor and nitrogen-containing precursor. The aluminum-containing precursor includes TMA, TEA, or other suitable chemical. The nitrogen-containing precursor includes ammonia, TBAm, phenyl hydrazine, or other suitable chemical.

The method 160 includes forming the second buffer layer 116 at step 164. The second buffer layer 116 is heterogeneous in the vertical direction perpendicular to the silicon substrate 110. In one embodiment, the second buffer layer 116 includes a graded aluminum gallium (AlGaN). In furtherance of the present embodiment, the graded AlGaN of the second buffer layer 116 has an aluminum concentration that decreases from the bottom surface to the top surface of the second buffer layer and has a gallium concentration that increases from the bottom surface to the top surface of the second buffer layer. Thus, the graded AlGaN layer is more similar to the AlN of the first buffer layer 114 at the bottom surface and is more similar to the GaN at the top surface for acceptable lattice mismatch. The AlGaN layer is selectively epitaxy grown on the AlN of the first buffer layer 114.

The second buffer layer 116 can be epitaxy grown by MOVPE using aluminum-containing precursor, gallium-containing precursor, and nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, TBAm, phenyl hydrazine, or other suitable chemical. During the epitaxy growth of the graded AlGaN layer, the supplies of precursors are dynamically tuned according to the expected concentrations of aluminum and gallium to form the expected graded structure.

Alternatively, the second buffer layer 116 includes a super lattice structure. The super lattice structure can also be epitaxy grown by MOVPE with alternative precursors. In one example, the second buffer layer 116 includes a super lattice structure of GaN and AlN (GaN/AlN). The GaN layers are epitaxy grown by MOVPE using gallium-containing precursor and nitrogen-containing precursor. The gallium-containing precursor includes TMG, TEG, or other suitable chemical. The nitrogen-containing precursor includes ammonia, TBAm, phenyl hydrazine, or other suitable chemical. In another example, the second buffer layer 116 includes a super lattice structure of GaN and AlGaN (GaN/AlGaN). The GaN/AlGaN super lattice structure can also be epitaxy grown by MOVPE with alternative precursors intended for GaN and AlGaN, respectively. In yet another example, the second buffer layer 116 includes a super lattice structure of two different AlGaN. The first AlGaN layers have a higher aluminum concentration and a lower gallium concentration. The second AlGaN layers have a lower aluminum concentration and a higher gallium concentration. The AlGaN super lattice structure can also be epitaxy grown by MOVPE with alternative concentrations of the corresponding precursors intended for the first and second AlGaN layers, respectively.

The method 160 includes forming the patterned blocking layer 112 on the second buffer layer 116 at step 166. A blocking layer 112 includes a dielectric material, such as silicon oxide, silicon nitride, or silicon oxynitride. The blocking layer 112 can be formed by CVD or other suitable deposition process.

The method 160 includes forming the gallium nitride layer 118 at step 168. The gallium nitride layer 118 is selectively epitaxy grown on the second buffer layer 116 within the plurality of regions 113. The GaN layer 118 is epitaxy grown by MOVPE using gallium-containing precursor and nitrogen-containing precursor. The gallium-containing precursor includes TMG, TEG, or other suitable chemical. The nitrogen-containing precursor includes ammonia, TBAm, phenyl hydrazine, or other suitable chemical.

The method 160 also includes step 170 to form one or more IC devices on the GaN layer 118. In various embodiments, the IC device includes a high power field-effect transistor, a high frequency device, a LED, or a HEMT.

The method 160 from step 162 to step 170 can be implemented to form the semiconductor structure 140 of FIG. 15.

Alternatively, the method 160 includes step 172 by forming the patterned blocking layer 112 on the silicon substrate 110; step 174 by selectively epitaxy growing the first buffer layer 114 on the silicon substrate 110 within the regions 113; and step 176 by selectively epitaxy growing the second buffer layer 116 on the first buffer layer 114 within the regions 113, followed by the subsequent step 168 to selectively grow the GaN layer 118 on the second buffer layer 116 within the regions 113, and step 170 to form one or more IC devices on the GaN layer 118. The method 160 from step 172 to 176, step 168, and step 170 can be implemented to form the semiconductor structure 100 of FIG. 4.

Figure 20:
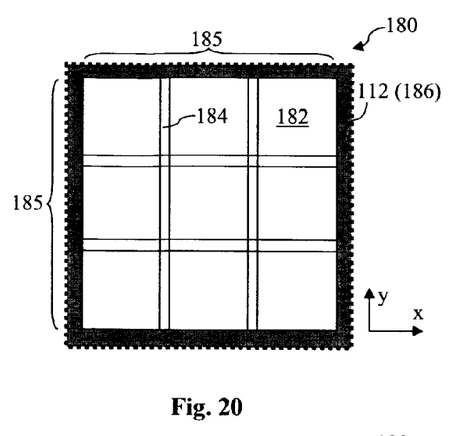
FIGS. 20 through 27 are top views of the semiconductor structure of FIG. 1 with a dielectric pattern constructed according to various other embodiments of the present disclosure.

Although various embodiments are provided according to the present disclosures. Other alternatives and embodiments may present without departure from the spirit of the present disclosure. For example, the block layer 112 can be patterned in various proper shapes and configurations for minimizing the wafer stress. In one embodiment, only a field 180 of the silicon substrate is illustrated in FIG. 20. In a lithography process to pattern the block layer 112, the image of the corresponding photomask is repeatedly transferred to each field on the silicon substrate 110. In a specific example, the field includes the image of the photomask formed by one exposure shot. Usually, one field includes a plurality of chips 182 separated by scribe lines 184. The field 180 includes a field main region 185 extending in x and y directions as illustrated in FIG. 20. The field 180 further includes frame regions 186 surrounding the field main region 185. The block layer 112 is patterned such that it is disposed in the frame regions 186. In the present example, the field 180 includes nine chips 182 separated by the scribe lines 184. By forming the block layer 112 in the frame regions 186, the circuit areas are maximized with enhanced packing density. Similar to FIG. 5, the blocking layer 112 includes a first set of features extended in a first direction (e.g., x direction) and a second set of features extended in a second direction (e.g., y direction). In the present embodiment, the first and second directions are perpendicular to each other. The first and second sets of features are straight lines extending over the substrate 110 and intersect to define the plurality regions 113. In FIG. 20, each field 180 only includes one of the plurality regions 113 overlapping with the field main region 185. In present example, the corresponding one of the regions 113 in FIG. 20 includes nine chips 182 in the field 180 and the adjacent scribe lines 184.

Figure 21:
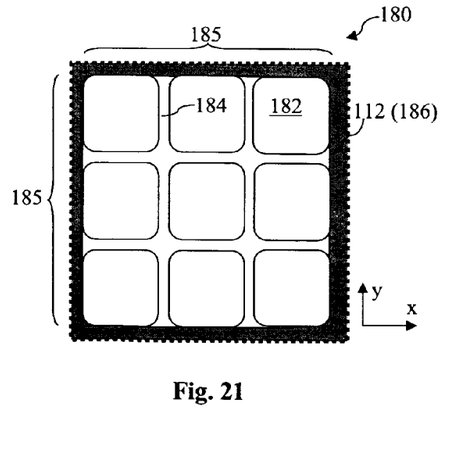

In another embodiment illustrated in FIG. 21, the block layer 112 is defined in the frame region 186 of the field 180 including a plurality of chips 182. Each of the chips 182 is surrounded by the scribe lines 184. In the present example, the field 180 includes nine chips 182 separated by the scribe lines 184. The block 112 is formed within the frame regions 186 and is patterned to define one of the regions 113 overlapping with the field main region 185. FIG. 21 is similar to FIG. 20 but the block layer 112 defines the plurality regions 113 with rounding corners.

Figure 22:
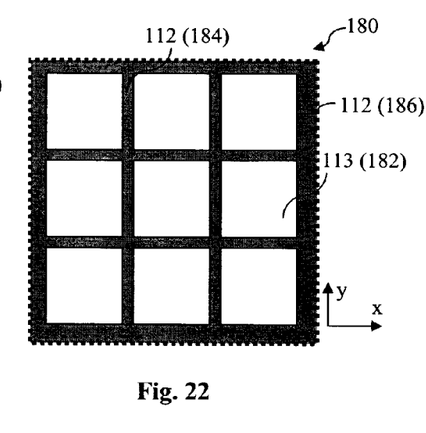

Another embodiment is illustrated in FIG. 22 similar to FIG. 20 but the block layer 112 is disposed in both the frame region 186 and the scribe lines 184. In this case, the block layer 112 is patterned to define the plurality of regions 113 in the field 180. The plurality of regions 113 correspond to the multiple chips 182 in each field 180. By forming the block layer 112 in the frame regions 186 and the scribe lines 182, the circuit areas are not negatively reduced since the block layer 112 is within non-circuit areas. Similar to FIG. 20, the blocking layer 112 includes a first set of features extended in a first direction (e.g., x direction) and a second set of features extended in a second direction (e.g., y direction). In the present embodiment, the first and second directions are perpendicular to each other. The first and second sets of features are straight lines extending over the substrate 110 and intersect to define the plurality regions 113.

Figure 23:
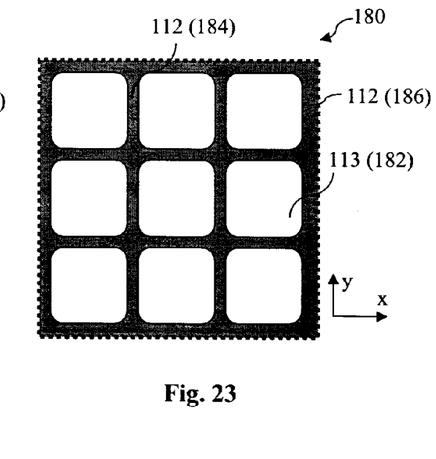

In another embodiment illustrated in FIG. 23, the block layer 112 is disposed in both the frame region 186 and the scribe lines 184. In this case, the block layer 112 is patterned to define the plurality of regions 113 in the field 180. The plurality of regions 113 correspond to the multiple chips 182 in each field 180. By forming the block layer 112 in the frame regions 186 and the scribe lines 182, the circuit areas are not negatively reduced since the block layer 112 is within non-circuit areas. FIG. 23 is similar to FIG. 22 but the block layer 112 defines the plurality regions 113 with rounding corners.

Figure 24:
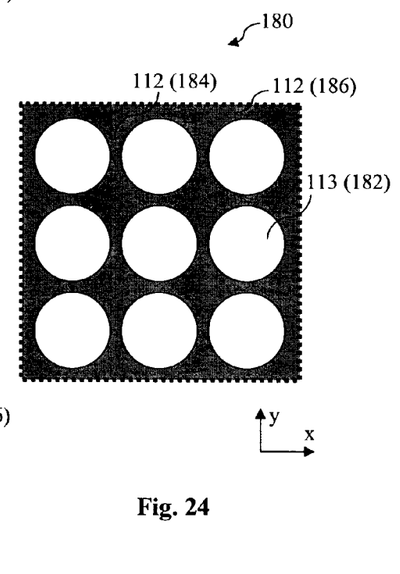

In another embodiment illustrated in FIG. 24, the block layer 112 is disposed in both the frame region 186 and the scribe lines 184. In this case, the block layer 112 is patterned to define the plurality of regions 113 in the field 180. The plurality of regions 113 correspond to the multiple chips 182 in each field 180. By forming the block layer 112 in the frame regions 186 and the scribe lines 182, the circuit areas are not negatively reduced since the block layer 112 is within non-circuit areas. FIG. 23 is similar to FIG. 22 but the block layer 112 defines the plurality regions 113 with rounding corners such that the plurality of regions 113 are substantially circular shaped.

Figure 25:
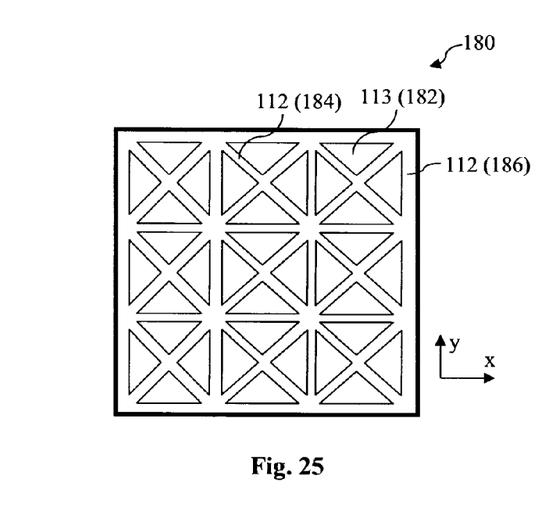

In another embodiment illustrated in FIG. 25, the block layer 112 is disposed in both the frame region 186 and the scribe lines 184. In this case, the block layer 112 is patterned to define the plurality of regions 113 in the field 180. The plurality of regions 113 correspond to the multiple chips 182 in the field 180. Similar to FIG. 6, the blocking layer 112 includes a first set of features extended in a first direction (x direction) and a second set of features extended in a second direction (y direction) different from the first direction. In the present embodiment, the first and second directions are perpendicular to each other. The first and second sets of features are straight lines extending over the silicon wafer. Additionally, the blocking layer 112 includes a third set of features extended in a third direction (e.g., a direction that equally splits the angle between the x and y directions) and a fourth set of features extended in a fourth direction (e.g., a direction perpendicular to the third directions). The third and fourth sets of features are straight lines extended over the silicon substrate 110. In one example, the first set of features are spaced from each other with a spacing ranging between about 100 microns and about 100 mm. In a similar example, the second, third, or fourth sets of features are spaced from each other with a spacing ranging between about 100 microns and about 100 mm. The first, second, third, and fourth sets of features are intersected, defining the plurality of regions 113 in triangle shapes. Accordingly, the chips 182 are in triangle shapes.

Figure 26:
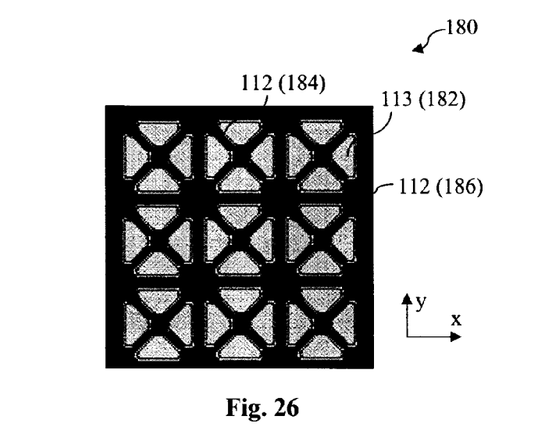

In another embodiment illustrated in FIG. 26, the block layer 112 is disposed in both the frame region 186 and the scribe lines 184. The block layer 112 is patterned to define the plurality of regions 113 in the field 180. The plurality of regions 113 correspond to the multiple chips 182 in each field 180. FIG. 26 is similar to FIG. 25 but the block layer 112 defines the plurality regions 113 with rounding corners. Particularly, the first, second, third and fourth sets of features intersect with rounding corners.

Figure 27:
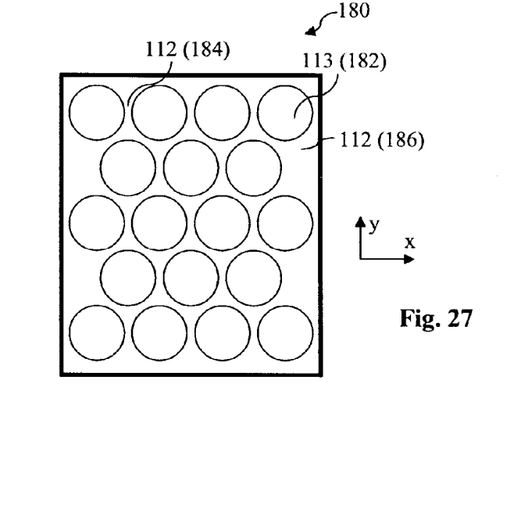

In another embodiment illustrated in FIG. 27, the block layer 112 is disposed in both the frame region 186 and the scribe lines 184. The block layer 112 is patterned to define the plurality of regions 113 in the field 180. The plurality of regions 113 correspond to the multiple chips 182 in the field 180. FIG. 27 is similar to FIG. 25 but the block layer 112 defines the plurality of regions 113 with rounding corners such that the plurality of regions 113 are substantially circular shaped. Particularly, the plurality of regions 113 are positioned such that an row of the regions 113 is disposed to have an offset with the adjacent row of the regions 113.

In another embodiment, the IC device formed on the GaN layer 118 includes an light-emitting diode (LED) designed to emit light with a particular emission spectrum and is formed on the GaN layer 118. The LED includes p-type doped and n-typed doped semiconductor layers configured to emit spontaneous radiation of the electromagnetic wave. In the present embodiment, the LED includes an n-type impurity doped cladding layer and a p-type doped cladding layer formed on the n-type doped cladding layer. In one embodiment, the n-type cladding layer includes n-type gallium nitride (n-GaN) doped by silicon or oxygen, and the p-type cladding layer includes p-type gallium nitride (p-GaN) doped by magnesium. The LED further includes an indium gallium nitride/gallium nitride (InGaN/GaN) multi-quantum well formed between the n-type doped cladding layer and p-type doped cladding layer. In another embodiment, two electrodes are formed and configured to couple with the n-GaN and p-GaN layers, respectively.

Thus, the present disclosure provides a semiconductor structure. The semiconductor structure includes a dielectric material layer on a silicon substrate, the dielectric material layer being patterned to define a plurality of regions; a first buffer layer disposed on the silicon substrate; a heterogeneous buffer layer disposed on the first buffer layer; and a gallium nitride layer grown on the heterogeneous buffer layer only within the plurality of regions.

The present disclosure also provides another embodiment of a semiconductor structure including a dielectric material layer on a silicon substrate. The dielectric material layer is patterned to have a first set of features extended in a first direction and a second set of features extended in a second direction different from the first direction, and the first set of features intersects the second set of features, defining a plurality of regions on the silicon substrate. The semiconductor structure also includes a first buffer layer disposed on the silicon substrate; a heterogeneous buffer layer disposed on the first buffer layer; and a gallium nitride layer selectively grown on the heterogeneous buffer layer within the plurality of regions.

The present disclosure also provides an embodiment of a method for making an integrated circuit. The method includes forming a dielectric material layer on a silicon substrate; patterning the dielectric material layer into lines, defining a plurality of regions on the silicon substrate; forming a first buffer layer on the silicon substrate; forming a heterogeneous buffer layer on the first buffer layer; and selectively epitaxy growing a gallium nitride layer on the heterogeneous buffer layer within the plurality of regions using the dielectric material layer as a hard mask.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making an integrated circuit, comprising:
   forming a dielectric material layer on a silicon substrate;
   patterning the dielectric material layer into lines, defining a plurality of regions on the silicon substrate;
   forming a first buffer layer on the silicon substrate;
   forming a heterogeneous buffer layer on the first buffer layer; and
   selectively epitaxy growing a gallium nitride layer on the heterogeneous buffer layer within the plurality of regions using the dielectric material layer as a hard mask, and
   wherein the forming and patterning the dielectric material layer are implemented after the forming the heterogeneous buffer layer on the first buffer layer.

2. The method of claim 1, wherein forming the dielectric material layer on the silicon substrate includes forming the dielectric material layer directly on the heterogeneous buffer layer.

3. The method of claim 1, wherein forming the dielectric material layer on the silicon substrate includes forming the dielectric material layer over the heterogeneous buffer layer and the first buffer layer such that the heterogeneous buffer layer and the first buffer layer are positioned between a portion of the silicon substrate and a portion of the dielectric material layer.

4. The method of claim 1, wherein selectively epitaxy growing the gallium nitride layer on the heterogeneous buffer layer within the plurality of regions using the dielectric material layer as the hard mask includes growing the gallium nitride layer directly on the heterogeneous buffer layer.

5. A semiconductor structure comprising:
   a dielectric material layer on a silicon substrate, the dielectric material layer being patterned to define a plurality of regions separated by the dielectric material layer, wherein the dielectric material layer has a bottom surface facing a top surface of the silicon substrate;
   a first buffer layer disposed on the silicon substrate;
   a heterogeneous buffer layer disposed on the first buffer layer; and
   a gallium nitride layer selectively grown on the heterogeneous buffer layer only within the plurality of regions, and
   wherein at least one of the first buffer layer and the heterogeneous buffer layer extends between the top surface of the silicon substrate and the bottom surface of the dielectric material layer to prevent a portion of the dielectric material layer from physically contacting the silicon substrate.

6. The semiconductor structure of claim 1, wherein the silicon substrate has a (111) oriented surface.

7. The semiconductor structure of claim 1, wherein the dielectric material layer includes a material selected from the group consisting of silicon oxide, silicon nitride, and silicon oxynitride.

8. The semiconductor structure of claim 1, wherein
   the first buffer layer includes aluminum nitride (AlN); and
   the heterogeneous buffer layer includes a graded aluminum gallium nitride (AlGaN) layer.

9. The semiconductor structure of claim 1, wherein
   the first buffer layer includes aluminum nitride (AlN); and
   the heterogeneous buffer layer includes a super lattice structure having one of GaN/AlN, GaN/AlGaN, and AlGaN.

10. The semiconductor structure of claim 1, wherein each of the plurality of regions corresponds to a chip surrounded by scribe lines.

11. The semiconductor structure of claim 1, wherein each of the plurality of regions is a field main region including multiple chips.

12. The semiconductor structure of claim 1, wherein
    the dielectric material layer includes a first set of features extended in a first direction and a second set of features extended in a second direction different from the first direction; and
    the first set of features intersects the second set of features, defining the plurality of regions.

13. The semiconductor structure of claim 12, wherein the first set of features and second set of features include solid lines and dashed lines;
    each of the solid lines and the dashed lines has a width ranging between about 0.1 micron and about 5 mm; and
    the solid lines and dashed lines in each of the first and second sets are spaced from each other with a spacing ranging between about 100 microns and about 100 mm.

14. The semiconductor structure of claim 12, wherein the first direction is perpendicular to the second direction and the plurality of regions are defined in square or rectangular shapes.

15. The semiconductor structure of claim 12, wherein the first set of features and the second set of features intersect with rounding corners.

16. A semiconductor structure comprising:
    a dielectric material layer on a silicon substrate, wherein the dielectric material layer is patterned to have a first set of features extended in a first direction and a second set of features extended in a second direction different from the first direction, and the first set of features intersects the second set of features, defining a plurality of regions on the silicon substrate;
    a first buffer layer disposed on the silicon substrate;
    a heterogeneous buffer layer disposed on the first buffer layer; and
    a gallium nitride layer grown on the heterogeneous buffer layer within the plurality of regions, wherein a portion of the gallium nitride layer physically contacts a portion of the dielectric material layer.

17. The semiconductor structure of claim 16, wherein the dielectric material layer is positioned within scribe lines.

18. The semiconductor structure of claim 16, wherein the plurality of regions are defined in circular shape.

19. The semiconductor structure of claim 16, wherein
    the first buffer layer includes aluminum nitride (AlN); and
    the heterogeneous buffer layer includes a graded aluminum gallium nitride (AlGaN) layer.

20. The semiconductor structure of claim 16, wherein
    the first buffer layer includes aluminum nitride (AlN); and
    the heterogeneous buffer layer includes a super lattice structure having one of GaN/AlN, GaN/AlGaN, and AlGaN.

21. The semiconductor structure of claim 16, wherein the dielectric material layer is directly disposed on one of the silicon substrate and the heterogeneous buffer layer.

22. The semiconductor structure of claim 16, wherein the first set of features
    include one of solid lines and dashed lines;

have a width ranging between about 0.1 micron the and about 5 mm; and are spaced from each other with a spacing ranging between about 100 microns and about 100 mm.

23. The semiconductor structure of claim 16, wherein
the dielectric material layer is patterned to further have a third set of features extended in a third direction and a fourth set of features extended in a fourth direction, the plurality of regions on the silicon substrate being defined by the first, second, third and fourth sets of features;

the third set of features intersects the fourth set of features; and the third and fourth directions are different from each other and different from the first and second directions.

24. The semiconductor structure of claim 23, wherein each of the plurality of regions is shaped to one of square, rectangle, and triangle.

25. The semiconductor structure of claim 24, wherein the first, second, third and fourth sets of features intersect with rounding corners.

* * * * *